United States Patent
Clara et al.

(10) Patent No.: US 7,327,193 B2
(45) Date of Patent: Feb. 5, 2008

(54) METHOD FOR SETTING AN AMPLIFIER, AND CORRESPONDING AMPLIFIER CIRCUIT

(75) Inventors: Martin Clara, Villach (AT); Antonio Di Giandomenico, Villach (AT); Klaus Kolhaupt, Villach (AT); Andreas Weiebauer, Pörtschach (AT)

(73) Assignee: Infineon Technologies AG, Munich (DE)

( * ) Notice: Subject to any disclaimer, the term of this patent is extended or adjusted under 35 U.S.C. 154(b) by 137 days.

(21) Appl. No.: 11/230,284

(22) Filed: Sep. 19, 2005

(65) Prior Publication Data
US 2006/0066401 A1    Mar. 30, 2006

(30) Foreign Application Priority Data
Sep. 21, 2004   (DE) .................. 10 2004 045 709

(51) Int. Cl.
*H03F 3/45* (2006.01)

(52) U.S. Cl. ..................................... 330/258; 330/260
(58) Field of Classification Search ................ 330/258, 330/260
See application file for complete search history.

(56) References Cited

U.S. PATENT DOCUMENTS 3,491,307 A * 1/1970 Solomon et al. ............ 330/256

* cited by examiner

*Primary Examiner*—Robert Pascal
*Assistant Examiner*—Alan Wong
(74) *Attorney, Agent, or Firm*—Brinks Hofer Gilson & Lione

(57) ABSTRACT

An amplifier and method of setting the amplifier is presented. The amplifier is set by setting a mean value between voltage values at first and second outputs of the amplifier. The mean value is pulled towards a certain voltage potential. A circuit node is coupled to the first and to the second output. The circuit node is connected, via at least one resistor and a respective switch, to the certain voltage potential assigned to the respective resistor.

31 Claims, 3 Drawing Sheets

METHOD FOR SETTING AN AMPLIFIER, AND CORRESPONDING AMPLIFIER CIRCUIT

PRIORITY CLAIM

This application claims the benefit of priority to German Patent Application DE 10 2004 045709.3 filed on Sep. 21, 2004, herein incorporated by reference in its entirety.

TECHNICAL FIELD

The present invention relates to a method for setting an amplifier, in particular, a feedback control of a mid-voltage of a fully differential operational amplifier, and to a corresponding amplifier circuit.

BACKGROUND

The dynamic range of conventional analog low-voltage circuits is greatly limited. In order to achieve an optimum output for a predetermined power input, a voltage range which can be processed by analog circuit parts is maximized. In the case of a low-voltage CMOS circuit, the output stages of operational amplifiers are thus located close to a supply voltage (rail-to-rail), i.e., only a transistor is disposed between the output of the operational amplifier and the supply voltage.

A typical fully differential two-stage operational amplifier circuit is represented in FIG. 1. In the amplifier circuit of FIG. 1, the Miller effect is compensated, the output stage is located close to the supply voltage, and feedback is provided for feedback control of the mid-voltage. An operational amplifier 12 amplifies a difference between an externally settable voltage $V_{CM}$ and a mean value of the voltage value of two outputs 3, 4 of the operational amplifier circuit such that the mean value is set to the voltage $V_{CM}$. In order to maximize the available voltage range at the output of the fully differential operational amplifier circuit, the voltage $V_{CM}$ should be set exactly in the middle of a voltage range in which the two output transistors $N_2$ are in saturation. That is to say, the optimum voltage $VCM_{opt}$ must satisfy the following equation:

$$VCM_{opt} = \frac{1}{2} * (V_{DD} - V_{SS} - V_{DSAT,P2} - V_{DSAT,N2}) \quad (1)$$

In equation (1), $V_{DD}$, $V_{SS}$ are supply voltages and $V_{DSAT,P2}$, $V_{DSAT,N2}$ are saturation voltages of the output transistors $N_2$. FIG. 2 shows an abstract model of the fully differential operational amplifier circuit of FIG. 1. The voltages at the outputs 3, 4 of the fully differential operational amplifier 11, which also correspond to the outputs 3, 4 of the fully differential operational amplifier circuit, are averaged by an averaging network 13, and a difference between a voltage present at a circuit node 5 and the externally settable voltage $V_{CM}$ is amplified and supplied to the control input 7 of the fully differential operational amplifier 11. In this case, the voltage $V_{CM}$ can also be applied as standard to the two gate terminals of two input transistors $P_1$ of the fully differential operational amplifier 11. In this case, however, certain problems occur.

In the case of very small supply voltages, the input transistors $P_1$ use a bias voltage that is less than $VCM_{opt}$. If, however, the voltage $V_{CM}$ is reduced from the optimum voltage $VCM_{opt}$, the voltage range of the output 3, 4 of the fully differential operational amplifier circuit is reduced by double the amount of reduction. In addition, other circuit parts may have an optimum mid-voltage which differs both from the voltage $VCM_{opt}$ and from the optimum bias voltage of the input transistors $P_1$.

The problems described above may be solved by making available different voltages and buffering these voltages in an appropriate manner. However, this solution increases the complexity and power consumption of the circuit.

SUMMARY

By way of introduction only, in one embodiment a method for setting an amplifier is provided. The amplifier has first and second outputs of first and second voltage values, respectively. The method comprises: setting a mean value between the first and second voltage values by pulling a circuit node coupled both to the first and second outputs towards a certain voltage potential; setting the amplifier in dependence on the mean value; and picking off a differential output signal of the amplifier.

In another embodiment an amplifier circuit comprises an amplifier having a first output and a second output, the amplifier circuit having a differential output signal; first circuit means for setting the amplifier circuit in dependence on a mean value between a first voltage value at the first output and a second voltage value at the second output; and second circuit means for setting the mean value between the first voltage value and the second voltage value. The second circuit means is designed such that the mean value is set by pulling a circuit node, which is connected both to the first output and to the second output, towards a certain voltage potential.

In another embodiment, an amplifier circuit comprises: a first amplifier having a first output and a second output, the amplifier circuit having a differential output signal; a first circuit connected between the first and second outputs and that sets the amplifier circuit in dependence on a mean value between a first voltage value at the first output and a second voltage value at the second output; and a plurality of series circuits (which contain a resistor of a different resistance than the other series circuits and transistor) connected between a node of the first circuit and different voltages. The node is connected both to the first and second outputs and has the mean value. Each series circuit contains a transistor and a resistor of a different resistance than the other series circuits.

The foregoing summary has been provided only by way of introduction. Nothing in this section should be taken as a limitation on the following claims, which define the scope of the invention.

BRIEF DESCRIPTION OF THE FIGURES

The application will be described below in greater detail on the basis of preferred embodiments and with reference to the accompanying drawings, in which.

DETAILED DESCRIPTION

Figure 1:
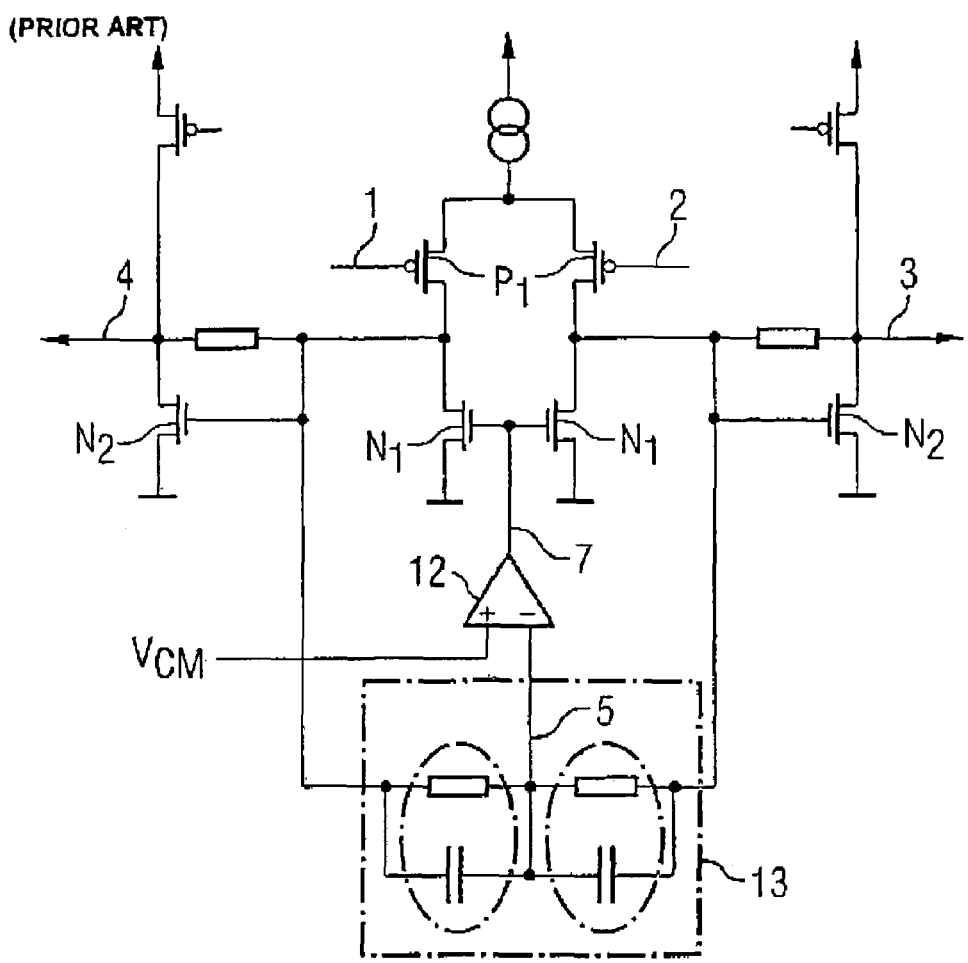
FIG. 1 shows a conventional fully differential operational amplifier circuit.
Figure 2:
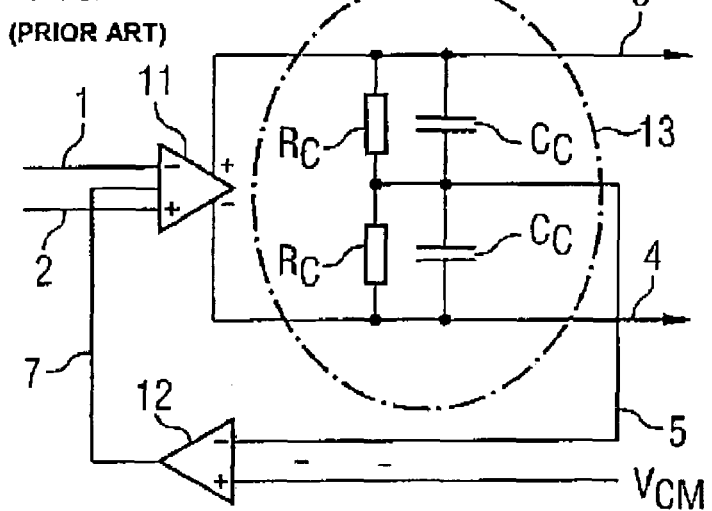
FIG. 2 shows an abstract circuit model of the fully differential operational amplifier circuit shown in FIG. 1.
Figure 3:
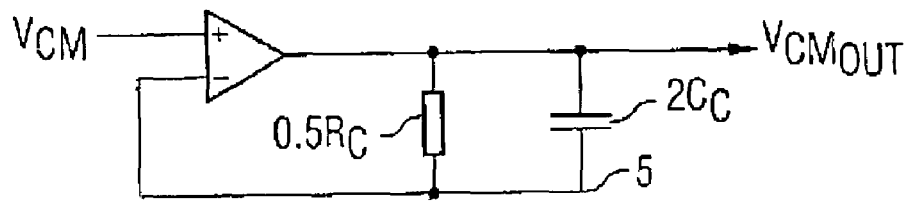
FIG. 3 shows an abstract circuit model of a feedback of the fully differential operational amplifier circuit shown in FIG. 2.

FIG. 3 abstracts a feedback of the fully differential operational amplifier circuit shown in FIG. 2, two outputs 3, 4 of a fully differential operational amplifier 11 having been combined to form a signal whose voltage value $VCM_{OUT}$ corresponds to a mid-voltage of the output of the fully differential operational amplifier circuit. An averaging network 13 in FIG. 2 can also be thereby simplified, in that it is expressed by a parallel connection of $0.5 * R_C$ and $2 * C_C$.

Figure 4:
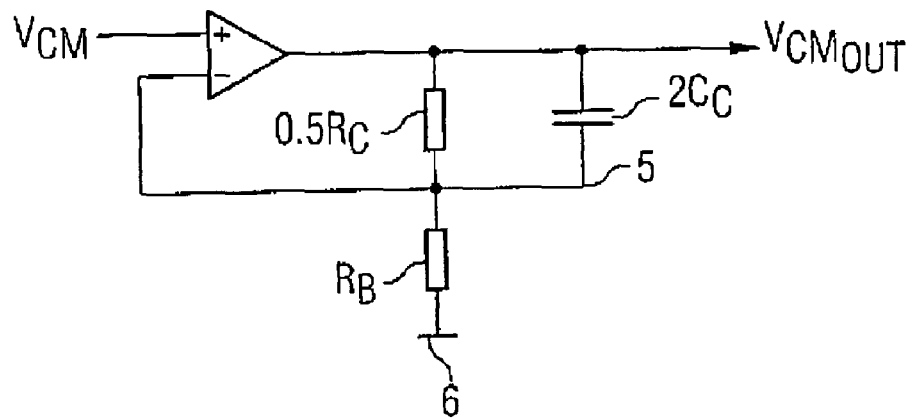
FIGS. 4 and 5 respectively show an expansion, according to the invention, of the abstract circuit model shown in FIG. 3.

In FIG. 4, a resistor $R_B$ is connected to an output 5 of the simplified averaging network, the other input of the resistor $R_B$ being connected to frame ground 6. In dependence on the resistance of the resistor $R_B$, the mid-voltage $VCM_{OUT}$ can be calculated as follows:

$$VCM_{OUT} = V_{CM} * \frac{\frac{R_C}{2} + R_B}{R_B} = V_{CM} * \left(1 + \frac{R_C}{2 * R_B}\right) \quad (2)$$

Figure 5:
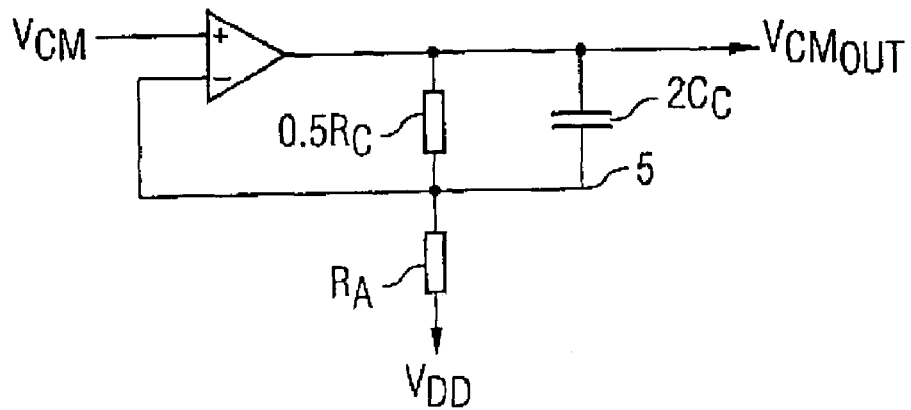

Similarly, in FIG. 5, a resistor $R_A$ is connected to the output 5 of the simplified averaging network, the other input of the resistor $R_A$ being connected to a supply voltage $V_{DD}$. Thus, in dependence on the resistance of the resistor $R_A$ and the supply voltage $V_{DD}$, the mid-voltage $VCM_{OUT}$ can be calculated as follows:

$$VCM_{OUT} = V_{CM} * \left(1 + \frac{R_C}{2 * R_A}\right) - V_{DD} * \frac{R_C}{2 * R_A} \quad (3)$$

The two equations ((2) and (3)) given above show that the mid-voltage $VCM_{OUT}$ of the fully differential operational amplifier circuit can be set to any value by appropriate selection of $R_A$ and $R_B$. In this case, the mid-voltage can also be set to be less than $V_{CM}$ if the supply voltage $V_{DD}$ is greater than the predetermined voltage $V_{CM}$.

Figure 6:
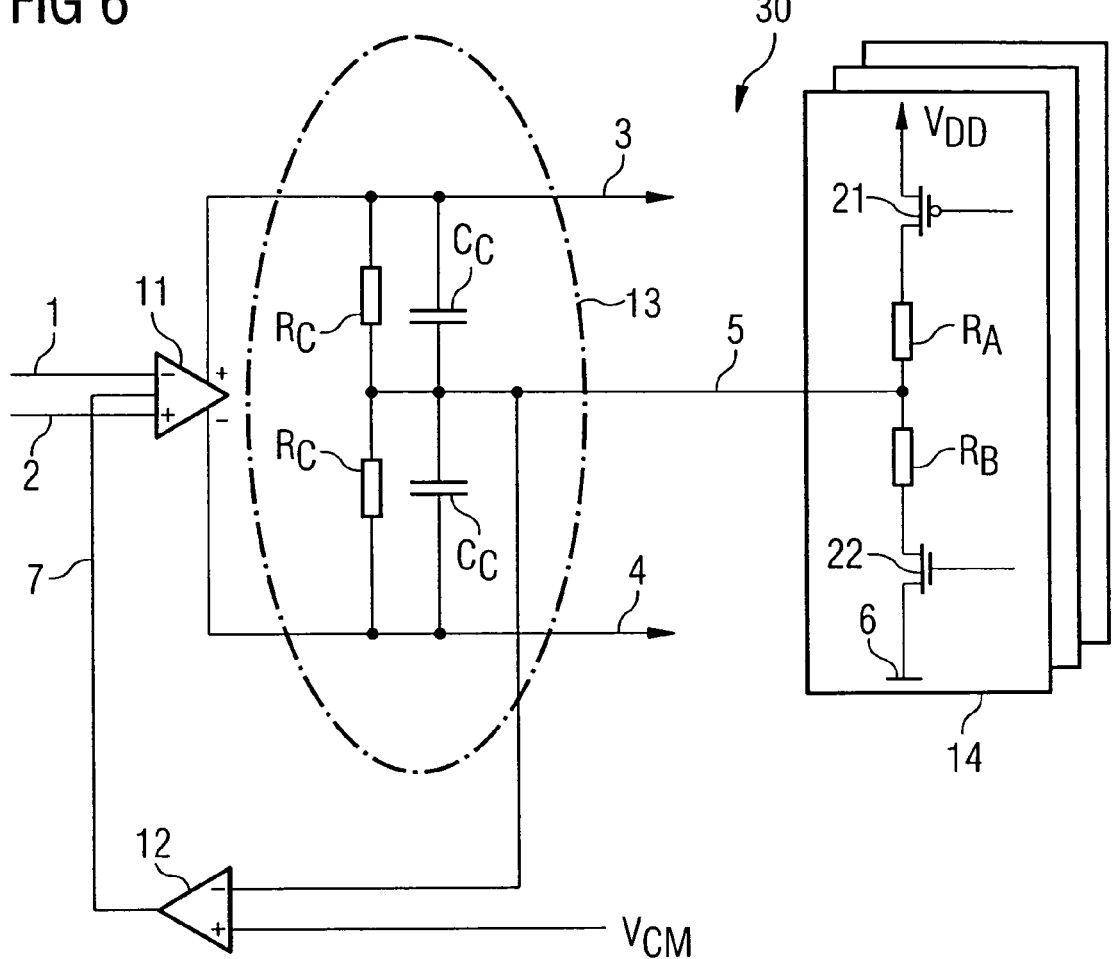
FIG. 6 shows, as an abstract circuit model, a fully differential operational amplifier circuit according to the invention.

FIG. 6 shows a fully differential operational amplifier circuit 30 with circuit expansions 14 shown in FIGS. 4 and 5, a respective transistor 21, 22 being additionally disposed between the resistor $R_A$ and the supply voltage $V_{DD}$ and between the resistor $R_B$ and the frame ground 6. The transistors 21, 22 can be MISFETs such as MOSFETs, BJTs, or other transistors known in the art.

If only one circuit expansion 14 is present, the mid-voltage can be set in the following four different ways, and consequently to four different voltage values, it being assumed that the predetermined voltage $V_{CM}$ is constant: both switches 21, 22 are open; switch 21 is closed and switch 22 is open; switch 22 is closed and switch 21 is open; or both switches 21, 22 are closed.

If a plurality of circuit expansions 14 is present, as shown in FIG. 6, the mid-voltage can be set to a corresponding multiplicity of voltage values, as a result of which the fully differential operational amplifier circuit 30 shown can be adapted to a corresponding multiplicity of requirements within an actual circuit (not shown).

Accordingly, a method is provided for setting an amplifier, such as a fully differential operational amplifier. The amplifier has first and second outputs, at which a differential output signal of the amplifier can be picked off. In this case, the amplifier is set in dependence on a settable mean value between a voltage value at the first output and a voltage value at the second output, in that a circuit node that is coupled both to the first output and to the second output is pulled towards a certain voltage potential.

As the circuit node that is coupled to the first and second outputs is pulled towards the certain voltage potential, a mid-voltage is set at the output of the amplifier. As a result of this, in turn, a voltage range is optimally set at the output of the amplifier. In this case, the amplifier can be set in dependence on a difference between the mean value and a predetermined voltage, this difference, in particular, being amplified.

Owing to the predetermined voltage, in addition to the setting possibility of pulling the circuit node to the voltage potential, a further setting possibility exists, whereby the mid-voltage, and consequently the voltage range at the output of the amplifier, can be set in a more flexible manner.

The mean value can be set in that the circuit node coupled to the first output and to the second output is pulled to the certain voltage potential across a resistor. It is thereby possible to set the mid-voltage, and consequently the voltage range at the output of the amplifier, through a selection of the resistance. It is substantially easier to realize a variation of the resistance than to realize a variation of a voltage that is applied to an input of an operational amplifier, thereby permitting easy setting of different mid-voltages.

The mean value can also be set such that the circuit node is pulled either across a first resistor to a first voltage potential, such as a supply voltage potential, or across a second resistor to a second voltage potential, such as frame ground. It is thereby possible, both to raise the mid-voltage towards the supply voltage potential or to lower the mid-voltage towards frame ground.

In addition, an amplifier circuit such as a fully differential operational amplifier circuit is provided. This amplifier circuit comprises an amplifier and first and second circuit means. The amplifier has a first and a second output, at which a differential output signal of the amplifier circuit can be picked off. By means of the first circuit means, the amplifier circuit is set in dependence on a mean value between a voltage value at the first output and a voltage value at the second output. This mean value is set, by means of the second circuit means, in that these second circuit means pull a circuit node, which is coupled both to the first and to the second output of the amplifier circuit, to a certain voltage potential.

The second circuit means may comprise at least one resistor which is connected to the circuit node in order to pull the circuit node to a voltage potential that is connected to the resistor. In this case, the resistor(s) may be settable in respect of its resistance value. Since the resistance value influences the mid-voltage at the output of the amplifier circuit, a setting of this resistance value alters the mid-voltage, and consequently the voltage range at the output of the amplifier circuit, in a manner which is substantially more simple in comparison with the prior art, wherein a voltage at an input of an operational amplifier is altered. A variable resistor can be realized using a T-element or an R2R network, which are known to one of ordinary skill in the art.

The second circuit means may comprise a plurality of resistors. In this case, each resistor can be connected, by means of a respective switch, to a voltage potential assigned to it. Owing to the fact that any quantity of these switches is closed or the remainder is opened, the circuit node is pulled, through appropriately selected resistors which are connected to a closed switch, towards voltage potentials assigned to the selected resistors, as a result of which a certain voltage value is set at the circuit node. In this case, at least one of these voltage potentials may be frame ground and at least one may be the supply voltage.

The use of switches enables the mid-voltage of the output of the amplifier circuit to be switched, e.g. also in a programmable manner, to one or more possible voltage values. The voltage value of the mid-voltage can thus be set to almost any value.

The first circuit means may comprise a further amplifier, for example an operational amplifier. In this case, a first input of the further amplifier is connected to the circuit node which, in particular, is provided by an averaging network, connected to the first and the second output, to form the mean value. A predetermined voltage is applied to the second input of the further amplifier. An output of the further amplifier is connected to a control input of the amplifier, thereby permitting feedback control of the mid-voltage at the output of the amplifier circuit in dependence on the predetermined voltage.

When all switches are open, the mid-voltage may be regulated only in dependence on the predetermined voltage, whereby a setting possibility, which is the sole setting possibility according to the prior art, is achieved.

The amplifier reduces a quantity of reference voltages used in a corresponding circuit, along with reducing buffering and distribution of the reference voltages. In conventional circuit, to the contrary, different reference voltages usually have to be centrally generated, buffered and distributed on the circuit. Accordingly, the conventional amplifier design is expensive, takes up space and consumes additional electric power. In addition, compared with the prior art, the present invention reduces the number of different fully differential operational amplifier circuits. The circuit complexity, the heterogeneity of the fully differential operational amplifier circuits and the power consumption are thus reduced.

The present invention is particularly suitable for fully differential operational amplifier circuits for microelectronic analog circuits operating in the low-voltage range (below 2V). Obviously, however, the present invention is not limited to this preferred domain of application, but is also suitable for general amplifier circuits, such as, for example, those used for analog parts of hybrid circuits or of circuits consisting mainly of digital circuit parts, these circuits also being able to operate with supply voltages that are greater than 2V.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A method for setting an amplifier having first and second outputs of first and second voltage values, respectively, the method comprising:
   setting a mean value between the first and second voltage values by pulling a voltage at a circuit node coupled both to the first and second outputs towards a certain voltage potential;
   setting the amplifier in dependence on the mean value;
   picking off a differential output signal of the amplifier;
   setting the amplifier in dependence on a difference between the mean value and a predetermined voltage; and
   amplifying the difference between the mean value and the predetermined voltage to set the amplifier.

2. The method according to claim 1, wherein the amplifier is a fully differential operational amplifier.

3. The method according to claim 1, wherein the voltage at the circuit node is pulled towards the certain voltage potential across a resistor.

4. An amplifier circuit comprising:
   an amplifier having a first output and a second output, the amplifier circuit having a differential output signal;
   first circuit means for setting the amplifier circuit in dependence on a mean value between a first voltage value at the first output and a second voltage value at the second output;
   second circuit means for setting the mean value between the first voltage value and the second voltage value, the second circuit means designed such that the mean value is set by pulling a voltage at a circuit node, which is connected both to the first output and to the second output, towards a certain voltage potential;
   wherein the second circuit means comprises a resistor which is connected to the voltage at the circuit node to pull the circuit node towards a voltage potential connected to the resistor; and
   wherein a resistance of the resistor is settable.

5. The amplifier circuit according to claim 4, wherein the amplifier circuit is a fully differential operational amplifier circuit.

6. The amplifier circuit according to claim 4, wherein the resistor comprises at least one of a T-element or an R2R network.

7. The amplifier circuit according to claim 4, wherein an averaging network having the circuit node is coupled to the first and second outputs to form the mean value.

8. An amplifier circuit comprising:
   a first amplifier having a first output and a second output, the amplifier circuit having a differential output signal;
   a first circuit connected between the first and second outputs and that sets the amplifier circuit in dependence on a mean value between a first voltage value at the first output and a second voltage value at the second output; and
   a plurality of second circuits connected between a node of the first circuit and different voltages, the node connected both to the first and second outputs, the node having the mean value.

9. The amplifier circuit according to claim 8, wherein each second circuit comprises a series circuit connected between the node and a different voltage, the series circuit containing a resistor and a switch.

10. The amplifier circuit according to claim 9, wherein each resistor has a different resistance.

11. The amplifier circuit according to claim 9, wherein a resistance of each resistor is settable.

12. The amplifier circuit according to claim 8, wherein the amplifier circuit is a fully differential operational amplifier circuit.

13. The amplifier circuit according to claim 8, wherein the first circuit comprises an RC network and a second amplifier, a first input of the second amplifier connected to the circuit node, a predetermined voltage applied to a second input of the second amplifier, and an output of the second amplifier connected to a control input of the first amplifier to provide feedback control of the mean value at the circuit node in dependence on the predetermined voltage.

14. A method for setting an amplifier having first and second outputs of first and second voltage values, respectively, the method comprising:
   setting a mean value between the first and second voltage values by pulling a voltage at a circuit node coupled both to the first and second outputs towards a certain voltage potential;
   setting the amplifier in dependence on the mean value; and
   picking off a differential output signal of the amplifier and selectively pulling the voltage at the circuit node either across a first resistor towards a first voltage potential or across a second resistor towards a second voltage potential.

15. The method according to claim 14, further comprising setting the amplifier in dependence on a difference between the mean value and a predetermined voltage.

16. The method according to claim 14, further comprising amplifying the difference between the mean value and the predetermined voltage to set the amplifier.

17. The method according to claim 14, wherein the amplifier is a fully differential operational amplifier.

18. The method according to claim 14, wherein the voltage at the circuit node is pulled towards the certain voltage potential across a resistor.

19. An amplifier circuit comprising:
   an amplifier having a first output and a second output, the amplifier circuit having a differential output signal;
   first circuit means for setting the amplifier circuit in dependence on a mean value between a first voltage value at the first output and a second voltage value at the second output; and
   second circuit means for setting the mean value between the first voltage value and the second voltage value, the second circuit means designed such that the mean value is set by pulling a voltage at a circuit node, which is connected both to the first output and to the second output, towards a certain voltage potential; and
   wherein the second circuit means comprise first and second resistors, a first switch assigned to the first resistor, and a second switch assigned to the second resistor, the voltage at the circuit node pulled selectively either across the first resistor towards a first voltage potential or across the second resistor towards a second voltage potential.

20. The amplifier circuit according to claim 19, wherein the amplifier circuit is a fully differential operational amplifier circuit.

21. The amplifier circuit according to claim 19, wherein the second circuit means comprises a resistor which is connected to the circuit node to pull the voltage at the circuit node towards a voltage potential connected to the resistor.

22. The amplifier circuit according to claim 21, wherein a resistance of the resistor is settable.

23. The amplifier circuit according to claim 21, wherein the resistor comprises at least one of a T-element or an R2R network.

24. The amplifier circuit according to claim 21, wherein an averaging network having the voltage at the circuit node is coupled to the first and second outputs to form the mean value.

25. The amplifier circuit according to claim 24, wherein the first circuit means comprises a further amplifier, a first input of the further amplifier connected to the voltage at the circuit node of the averaging network, a predetermined voltage applied to a second input of the further amplifier, and an output of the further amplifier connected to a control input of the amplifier to provide feedback control of the mean value at the circuit node of the averaging network in dependence on the predetermined voltage.

26. An amplifier circuit comprising:
   an amplifier having a first output and a second output, the amplifier circuit having a differential output signal;
   first circuit means for setting the amplifier circuit in dependence on a mean value between a first voltage value at the first output and a second voltage value at the second output;
   second circuit means for setting the mean value between the first voltage value and the second voltage value, the second circuit means designed such that the mean value is set by pulling a voltage at a circuit node, which is connected both to the first output and to the second output, towards a certain voltage potential;
   wherein an averaging network having the circuit node is coupled to the first and second outputs to form the mean value; and
   a further amplifier, a first input of the further amplifier connected to the circuit node of the averaging network, a predetermined voltage applied to a second input of the further amplifier, and an output of the further amplifier connected to a control input of the amplifier to provide feedback control of the mean value at the circuit node of the averaging network in dependence on the predetermined voltage.

27. The amplifier circuit according to claim 26, wherein the amplifier circuit is a fully differential operational amplifier circuit.

28. The amplifier circuit according to claim 26, wherein the second circuit means comprises a resistor which is connected to the voltage at the circuit node to pull the circuit node towards a voltage potential connected to the resistor.

29. The amplifier circuit according to claim 28, wherein a resistance of the resistor is settable.

30. The amplifier circuit according to claim 28, wherein the resistor comprises at least one of a T-element or an R2R network.

31. The amplifier circuit according to claim 26, wherein the second circuit means comprise first and second resistors, a first switch assigned to the first resistor, arid a second switch assigned to the second resistor, the voltage at the circuit node pulled selectively either across the first resistor towards a first voltage potential or across the second resistor towards a second voltage potential.

* * * * *

UNITED STATES PATENT AND TRADEMARK OFFICE
CERTIFICATE OF CORRECTION

PATENT NO. : 7,327,193 B2  
APPLICATION NO. : 11/230284  
DATED : February 5, 2008  
INVENTOR(S) : Martin Clara et al.

Page 1 of 1

It is certified that error appears in the above-identified patent and that said Letters Patent is hereby corrected as shown below:

In the Claims

Column 8, in claim 31, line 3, after "the first resistor," delete "arid" and substitute --and-- in its place.

Signed and Sealed this

Twenty-fourth Day of June, 2008

JON W. DUDAS  
*Director of the United States Patent and Trademark Office*

UNITED STATES PATENT AND TRADEMARK OFFICE
CERTIFICATE OF CORRECTION

| | | |
|---|---|---|
| PATENT NO. | : 7,327,193 B2 | Page 1 of 1 |
| APPLICATION NO. | : 11/230284 | |
| DATED | : February 5, 2008 | |
| INVENTOR(S) | : Martin Clara et al. | |

It is certified that error appears in the above-identified patent and that said Letters Patent is hereby corrected as shown below:

In the Claims

Column 8, in claim 31, line 53, after "the first resistor," delete "arid" and substitute --and-- in its place.

This certificate supersedes the Certificate of Correction issued June 24, 2008.

Signed and Sealed this

Twenty-second Day of July, 2008

JON W. DUDAS
*Director of the United States Patent and Trademark Office*

UNITED STATES PATENT AND TRADEMARK OFFICE
CERTIFICATE OF CORRECTION

PATENT NO. : 7,327,193 B2 Page 1 of 1
APPLICATION NO. : 11/230284
DATED : February 5, 2008
INVENTOR(S) : Martin Clara et al.

It is certified that error appears in the above-identified patent and that said Letters Patent is hereby corrected as shown below:

On the Title Page:

Item (75), line 10, delete "Weiebauer" and substitute -- Wiesbauer -- in its place.

Signed and Sealed this

Sixth Day of January, 2009

JON W. DUDAS
*Director of the United States Patent and Trademark Office*